United States Patent
Shue

(10) Patent No.: US 6,281,127 B1
(45) Date of Patent: Aug. 28, 2001

(54) SELF-PASSIVATION PROCEDURE FOR A COPPER DAMASCENE STRUCTURE

(75) Inventor: Shau-Lin Shue, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/292,364

(22) Filed: Apr. 15, 1999

(51) Int. Cl.$^7$ .................................................. H01L 21/302
(52) U.S. Cl. ........................... 438/691; 438/692; 438/958
(58) Field of Search ................................... 438/690, 691, 438/692, 672, 958; 148/537, 282

(56) References Cited

U.S. PATENT DOCUMENTS

| | | | |
|---|---|---|---|
| 5,098,852 | * 3/1992 | Niki et al. ................................ | 437/11 |
| 5,676,587 | 10/1997 | Landers et al. ......................... | 451/57 |
| 5,693,563 | * 12/1997 | Teong .................................... | 437/190 |
| 5,721,168 | * 2/1998 | Wu ........................................ | 438/253 |
| 5,731,245 | 3/1998 | Joshi et al. ............................ | 438/705 |
| 5,744,376 | 4/1998 | Chan et al. ............................ | 437/190 |
| 5,766,379 | * 6/1998 | Lanford et al. ....................... | 148/537 |
| 5,795,821 | * 8/1998 | Bacchette et al. .................... | 438/624 |
| 5,821,168 | 10/1998 | Jain ........................................ | 438/692 |
| 5,946,567 | * 8/1999 | Weng et al. .......................... | 438/250 |

OTHER PUBLICATIONS

P. J. Ding et al., Annealing of boron–implanted corrosion resistant copper films, J.Appl. Phys. 74 (2), P–1331–1334, Jul. 1993.*

* cited by examiner

Primary Examiner—Benjamin L. Utech
Assistant Examiner—Kin-Chan Chen
(74) Attorney, Agent, or Firm—George O. Saile; Stephen B. Ackerman

(57) ABSTRACT

Processes for creating a boron containing copper region, in a top portion of a copper damascene structure, have been developed. The boron containing copper region, used to protect exposed regions of the copper damascene structure, from reactants used for subsequent processing procedures, can be formed via ion implantation of boron ions, placed in exposed regions of the copper damascene structure, after completion of an initial CMP procedure. The copper damascene structure is then protected by the boron containing copper region, during subsequent processing procedures, such as a final CMP procedure, employed to insure complete removal of unwanted materials, as well as during subsequent CVD procedures, using $NH_3$ and $SiH_4$, as reactants.

7 Claims, 3 Drawing Sheets

SELF-PASSIVATION PROCEDURE FOR A COPPER DAMASCENE STRUCTURE

BACKGROUND OF THE INVENTION (1) Field of the Invention

The present invention relates to methods used to fabricate semiconductor devices, and more specifically to a process used to fabricate a copper damascene structure, in an opening in an insulator layer.

(2) Description of the Prior Art

The ability of the semiconductor industry to use copper structures, in place of higher resistivity, aluminum counterparts, have allowed reductions in performance degrading RC delays to be realized. In addition, the ability to create dual damascene copper structures, comprised of copper interconnect structures, in an overlying, wide diameter opening in an insulator layer, as well as comprised of copper via structure, located in the underlying, narrow diameter opening, has reduced process complexity and cost, when compared to counterparts, in which individual patterning procedures are used for the metal interconnect and for the metal via structures. However to successfully fabricate damascene copper structures, procedures such as chemical mechanical polishing, (CMP), have to be used to remove copper from all regions, except from the copper residing in the damascene opening. The chemistry of the alumina slurry, used for CMP removal of unwanted copper, usually acidic, can however result in unwanted corrosion of the top surface of the damascene copper structure, as a result of the CMP procedure, or unwanted corrosion of exposed regions of the copper damascene structure can result from reactants used during subsequent insulator depositions.

This invention will describe novel procedures, used to reduce, or prevent, the extent of copper corrosion, resulting from the CMP procedure, or from a subsequent insulator deposition procedure. A first procedure is the ion implantation of boron ions, into a dual damascene, or damascene, copper structure, prior to implementing an over-polish cycle, of the CMP procedure, used to insure complete removal of unwanted regions of copper. The boron implantation procedure selectively creates a corrosion resistant, boron containing copper region, in a top portion of the copper damascene structure, which protects the exposed copper surface during subsequent processing procedures, such as the final, or CMP over-etch, cycle, as well as protecting from reactants, such as $NH_3$ or $SiH_4$, used during a plasma enhanced chemical vapor deposition, (PECVD), procedure, used to deposit an overlying silicon nitride layer.

A second procedure, used to protect copper surfaces from finishing CMP cycles, or from the reactants used for deposition of subsequent insulator layers, is to form the opening, needed for the copper damascene structure, in a composite insulator layer, comprised of a borosilicate glass, (BSG), or a borophosphosilicate glass, (BPSG), layer, overlying a silicon oxide layer. After copper filling of the opening, the CMP procedure, after removing copper from the top surface of the BSG layer, will move boron from the exposed BSG layer, to the copper surface, exposed in the opening, forming the desired, boron containing region, in a top portion of the copper damascene structure. Prior art, such as Joshi et al, in U.S. Pat. No. 5,731,254, describe a process for forming a capping layer, for copper structures, via creation of a germanium-copper hard cap layer. However that prior art does not selectively place boron ions, in a top portion of the copper structure. A second prior art, Landers et al, in U.S. Pat. No. 5,676,587, describe the use of BSG, as a component of the composite insulator layer, in which the damascene type opening is formed in. However that prior art caps the BSG layer with a barrier layer. Therefore the subsequent CMP procedure never interfaces with the underlying BSG layer.

SUMMARY OF THE INVENTION

It is an object of this invention to form a copper damascene structure, in opening created in an insulator layer.

It is another object of this invention to create a corrosion protective, boron containing copper layer, in a top portion of the copper damascene structure, located in the opening an insulator layer, via ion implantation of boron ions, into a top portion of the copper damascene structure.

It is still another object of this invention to create an opening for the copper damascene structure, in a composite insulator layer, comprised of an overlying borosilicate glass, (BSG), layer, or of an overlying borophosphosilicate glass, (BPSG), layer, and comprised of an underlying silicon oxide layer.

It is still yet another object of this invention to form a corrosion protective, boron containing copper layer, in a top portion of a copper damascene structure, at the conclusion of the chemical mechanical polishing, (CMP), procedure, used to remove unwanted regions of copper, from the top surface of the BSG, or BPSG layer, via movement of boron, from the BSG or BPSG layer, to the surface of the copper damascene structure.

In accordance with the present invention, a process for forming a corrosion resistant, boron containing copper region, in a top portion of a copper damascene structure, has been developed. After creating an opening, in an insulator layer, to be used to accommodate the subsequent copper damascene structure, a barrier layer, and a copper seed layer are deposited, followed by copper filling of the damascene type opening, via chemical vapor deposition, (CVD), or via electroplating techniques. A first CMP procedure is used to remove unwanted regions of copper, and barrier layer, from the top surface of the insulator layer, resulting in a copper damascene structure, located in the damascene type opening. Prior to a final CMP procedure, used to insure complete removal of copper and barrier layer, from the top surface of the insulator layer, a boron ion implantation procedure is employed to create a boron containing, copper region, in a top portion of the copper damascene structure. The boron containing copper region, protects the copper damascene structure from subsequent corrosion initiating procedures, such as a final CMP procedure, a post CMP clean procedure, and subsequent CVD procedures.

Another iteration of this invention, forming a boron containing copper region, in a top portion of a copper structure, features the creation of the damascene type opening, in a composite insulator layer, comprised with an overlying BSG or BPSG layer. After depositing a barrier layer, and copper seed layer, the opening is filled with a CVD, or with an electroplated copper layer, followed by subjection to a first CMP procedure, removing copper and barrier layer, from the top surface of the BSG or BPSG layer. A second CMP procedure, used to insure complete removal of copper or barrier layer, results in movement of boron from the BSG or BPSG layer, to the copper damascene structure, resulting in a boron containing copper region, located in a top portion of the copper damascene structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
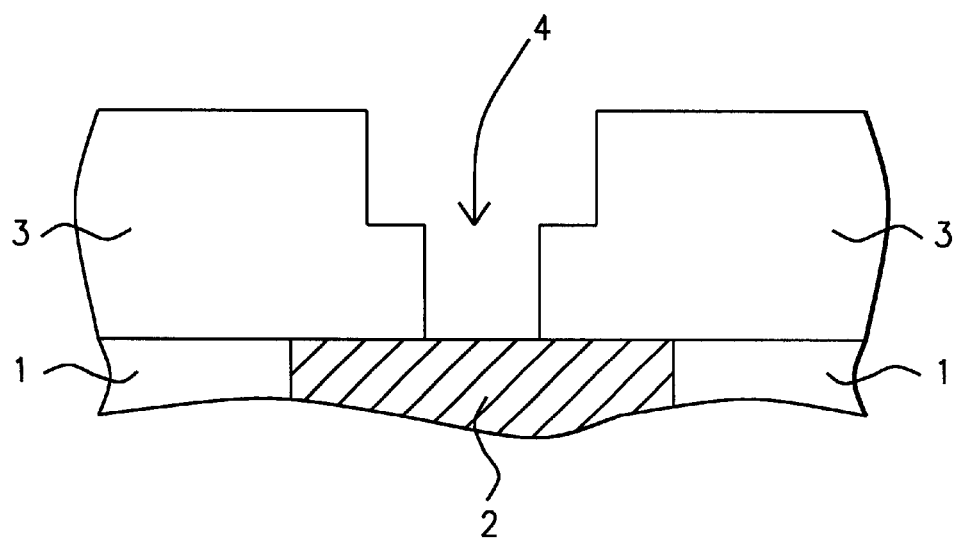
FIGS. 1–4, which schematically, in cross-sectional style, describe a first embodiment of this invention, featuring a boron ion implantation procedure, used to selectively create a boron containing copper region, in a top portion of a copper damascene structure.

The methods used to create a boron containing copper region, in a top portion of a copper damascene structure, used to protect the copper damascene structure from subsequent corrosive processing procedures, will now be described in detail. A first iteration of this invention is described in FIGS. 1–4. An underlying metal interconnect structure 2, comprised of either an aluminum based layer, a refractory metal layer, such as tungsten, or a copper layer, schematically shown in FIG. 1, is embedded in insulator layer 1. Insulator 1, can be either a silicon oxide layer, a BSG layer, or a BPSG layer. Insulator layer 3, a silicon oxide layer, is deposited via low pressure chemical vapor deposition, (LPCVD), or plasma enhanced chemical vapor deposition, (PECVD), procedures, to a thickness between about 4000 to 10000 Angstroms. Insulator 3, can also be comprised of a low k dielectric layer, other than silicon oxide, or be comprised of a composite dielectric layer. Conventional photolithographic and anisotropic, reactive ion etching, (RIE), procedures, using $CHF_3$ as an etchant, are used to create a damascene type opening, (not shown in the drawings), or dual damascene type opening 4, which is schematically shown in FIG. 1. Opening 4, is created via a first photolithographic and RIE procedure, using $CHF_3$ as an etchant, creating a narrow opening, in a top portion of insulator layer 3. After removal of the narrow opening, defining photoresist shape, a second photolithographic and RIE procedure, again using $CHF_3$ as an etchant, is used to create a wide opening, in the top portion of insulator layer 3. The second RIE procedure results in the transfer of the narrow opening, from the top portion, to the bottom portion of insulator layer 3, resulting in dual damascene type opening 4, in insulator 3, exposing a portion of the top surface of underlying metal interconnect structure 2. This is schematically shown in FIG. 1.

After removal of the photoresist shape, used to define the wide diameter opening, of dual damascene type opening 4, via plasma oxygen ashing and careful wet cleans, a barrier layer 5, comprised of tantalum, or tantalum nitride, is deposited via R.F. sputtering. Barrier layer 5, will prevent reaction between a subsequent copper layer, and adjacent materials. A copper seed layer, not shown in the drawings, is next deposited, again via R.F. sputtering, or via a high density plasma sputtering procedure. The copper seed layer allows deposition copper layer 6a, to be performed via electroplating procedures, using a solution of copper sulfate and sulfuric acid, with organic additions. Copper layer 6a, can also be obtained via chemical vapor deposition, at a deposition temperature between about 120 to 230° C. Copper layer 6a, completely fills dual damascene type opening 4, and also overlays barrier layer 5, and the copper seed layer, in regions overlying insulator layer 3. This is shown schematically in FIG. 2.

The desired copper damascene structure, located in opening 4, can also be achieved via removal of the regions of copper layer 6a, and barrier layer 5, overlying the top surface of insulator layer 3, via selective RIE procedures. However a CMP procedure, used for removal of unwanted regions of copper layer 6a, and barrier layer 5, is less costly than counterpart RIE removal procedures, and thus used to reduce the cost of the semiconductor chip. The polishing slurry, used for the CMP procedure, with a pH between about 1 to 2, can however result in corrosion of exposed regions of the copper damascene structure, during the final stages of the CMP procedure, or during subsequent process steps, such as a CMP cleanup, or during subsequent CVD procedures. A first solution to the copper corrosion phenomena, as a result of CMP, or post-CMP procedures, is described schematically in FIGS. 3–4. An initial CMP procedure is used to remove copper layer 6a, and barrier layer 5, from the top surface of insulator layer 3, with the initial CMP procedure, terminated at the appearance of the top surface of insulator layer, or silicon oxide layer 3. The result of the initial CMP procedure, is copper damascene structure 6b, in opening 4, shown schematically in FIG. 3. However to insure complete removal of copper layer 6a, and barrier layer 5, from the top surface of silicon oxide layer 3, a final CMP procedure is needed. However during the final CMP procedure, reaction between the exposed top surface of copper damascene structure 6b, and the acidic components of the CMP slurry, can result in corrosion of exposed copper.

Figure 4:
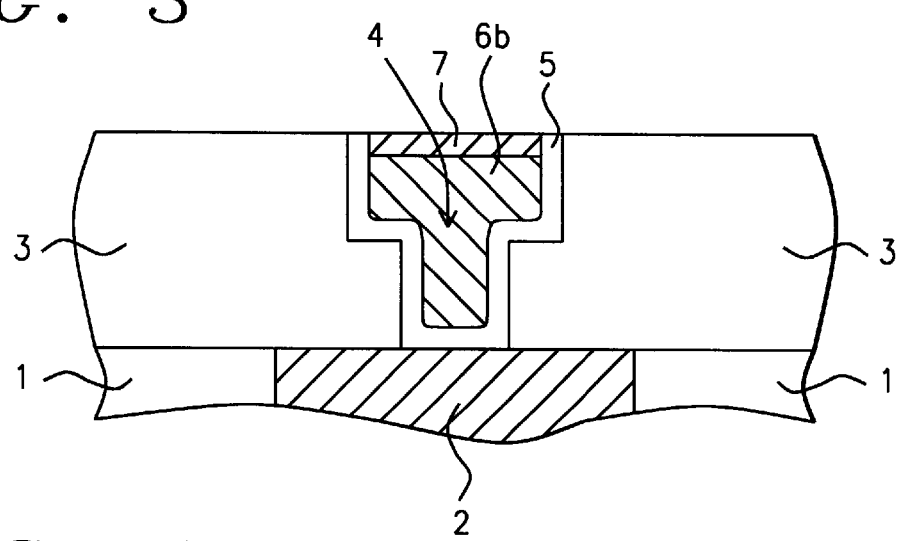

A solution for the corrosion of copper, during a final CMP procedure, is the formation of a boron containing copper region 7, created prior to performing the final CMP procedure. A boron containing copper region, offers protection from the components of CMP procedures, and thus allows a final CMP procedure to be used, insuring complete removal of unwanted materials. Boron containing copper region 7, shown schematically in FIG. 4, is obtained via ion implantation of boron ions, at an energy between about 20 to 40 KeV, at a dose between about 1E15 to 5E15 atoms/$cm^2$. In addition to offering protection of copper damascene structure 6b, during the final CMP procedure, boron containing copper region 7, between about 800 to 1500 Angstroms, in thickness, also offers protection to underlying copper damascene structure 6b, from reactants such as $NH_3$ and $SiH_4$, used in subsequent LPCVD or PECVD procedures, used for deposition of overlying insulator layers, such as silicon nitride, or silicon oxide.

Figure 5:
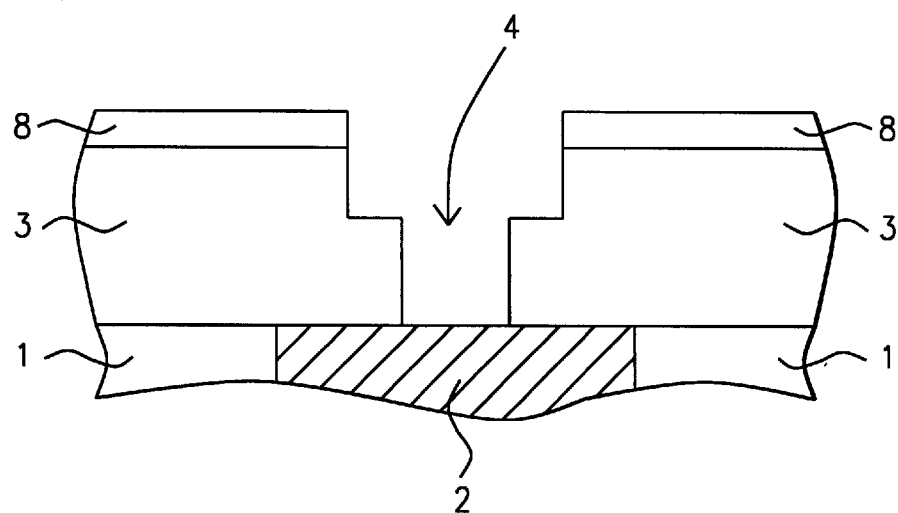
FIGS. 5–7, which schematically, in cross-sectional style, describe a second embodiment of this invention, featuring a CMP procedure, used to remove unwanted regions of copper, from the top surface of a BSG, or from the top surface of a BPSG layer, while creating the desired boron containing copper region, in a top portion of the copper structure.
Figure 6:
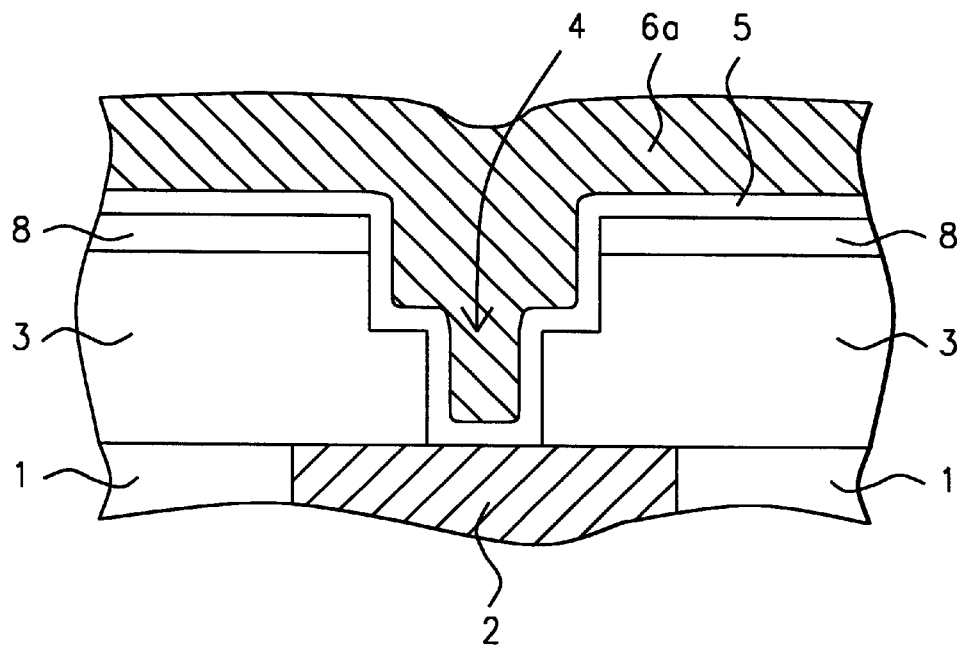
Figure 7:
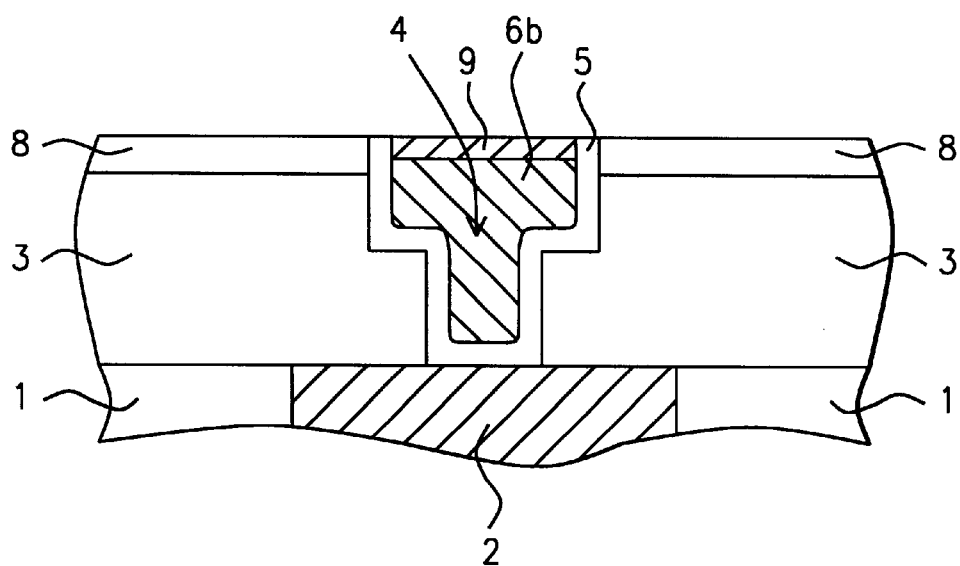

A second method of forming the desired boron containing copper region, is described using FIGS. 5–7. Dual damascene type opening 4, schematically shown in FIG. 5, is created in a composite insulator layer, comprised of a borosilicate glass, (BSG), or of a borophosphosilicate glass, (BPSG), layer 8, overlying silicon oxide layer 3. Silicon oxide layer 3, is again obtained via LPCVD or PECVD procedures, at a thickness between about 2000 to 14000 Angstroms, while BSG or BPSG layer 8, is also obtained using LPCVD or PECVD procedures, at a thickness between about 2000 to 3000 Angstroms, using tetraethylorthosilicate, (TEOS), and diborane as reactants. (If BPSG is used, phosphie is added as a reactant). The amount of $B_2O_3$, in BSG or BPSG layer 8, is between about 2 to 6 weight percent. Dual damascene type opening 4, shown schematically in FIG. 5, is created using identical photolithographic and RIE procedures, previously described for FIG. 1.

Figure 2:
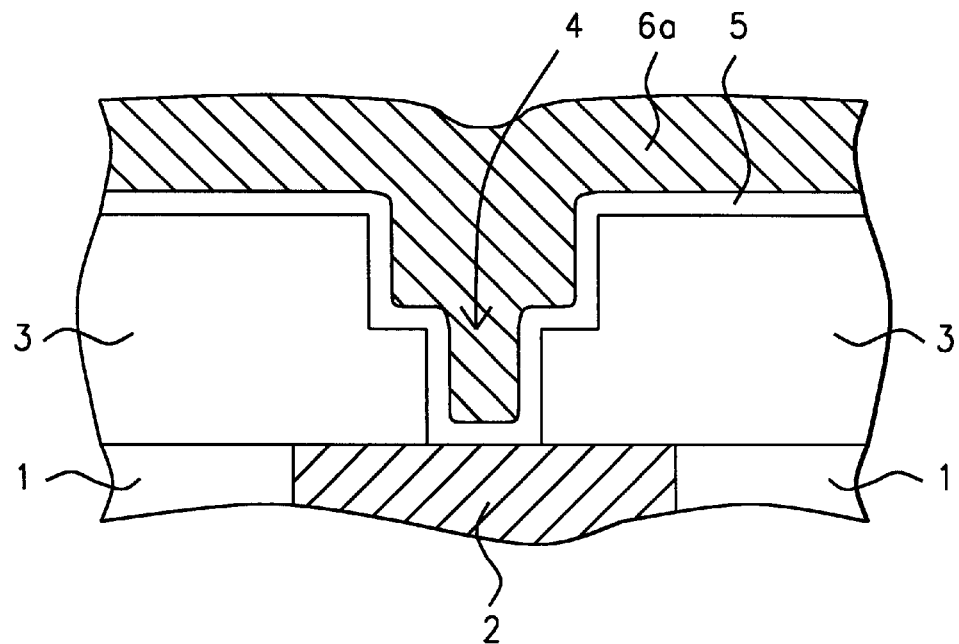
Figure 3:
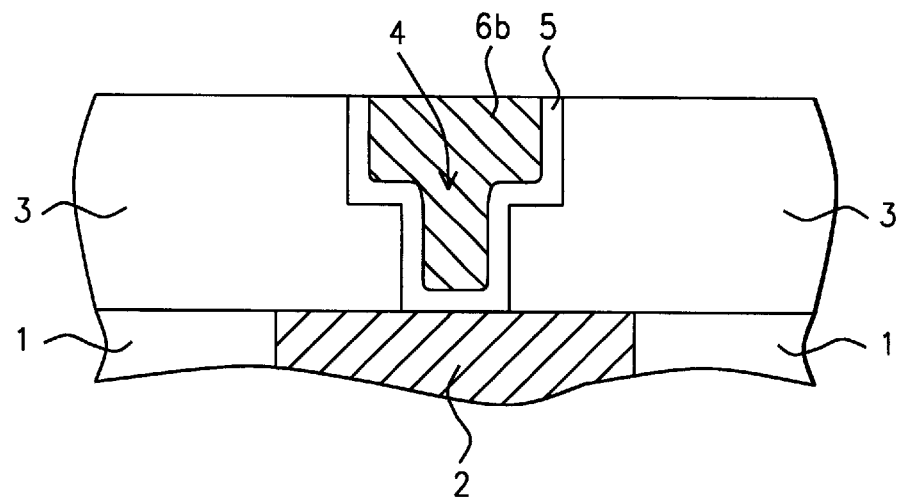

After removal of the photoresist shape, used to create dual damascene type opening 4, in the composite insulator layer, a barrier layer of tantalum nitride 5, and a copper seed layer, (not shown in the drawings), are again deposited, using the identical conditions and thicknesses, previously used and described for FIG. 2. Copper layer 6a, is again used to completely fill opening 4, again via electroplating, or via CVD procedures. This is schematically shown in FIG. 6. A CMP procedure, is again employed to remove regions of copper layer 6a, and barrier layer 5, from the top surface of BPSG or BSG layer 8, resulting in the creation of copper damascene structure 6b, located in opening 4. For this iteration only a single step, CMP procedure is used to provide both the initial CMP procedure, used to remove unwanted materials, and the final CMP procedure, used to insure complete removal of unwanted materials. However at the conclusion of the initial CMP procedure, with the appearance of the top surface of BPSG or BSG layer 8, the final CMP procedure is continued, resulting in movement, and/or diffusion, of boron, from the exposed BSG or BPSG layer, to exposed regions of copper damascene structure 6b, resulting in the creation of boron containing copper region 9, located in a top portion of copper damascene structure 6b. Boron containing copper region 9, schematically shown in FIG. 7, between about 500 to 1200 Angstroms, in thickness, again will offer protection to copper damascene structure 6b, during subsequent processing procedures, such as CMP cleanup, or LPCVD, or PECVD procedures, using $NH_3$ and $SiH_4$ as reactants.

While this invention has been particularly shown and described with reference to the preferred embodiments thereof, it will be understood by those skilled in the art that various changes in form and details may be made without departing from the spirit and scope of the invention.

What is claimed is:

1. A method of fabricating a copper damascene structure, on a semiconductor substrate, featuring a boron containing copper layer formed via implantation of boron into a partially formed copper damascene structure, which is defined using a first chemical mechanical polishing (CMP), followed by a second CMP procedure used to complete the formation of said copper damascene structure, comprising the steps of:

providing an underlying metal interconnect structure;

depositing an insulator layer on said underlying metal interconnect structure;

forming an opening in said insulator layer, exposing a portion of the top surface of said underlying metal interconnect structure;

depositing a barrier layer on the walls of said opening; on the portion of said underlying metal interconnect structure, exposed in said opening; and on the top surface of said insulator layer;

depositing a thick copper layer, on said barrier layer, completely filling said opening, located in said insulator layer;

performing said first chemical mechanical polishing, (CMP), procedure, removing regions of said thick copper layer, and of said barrier layer, from the top surface of said insulator layer, resulting in said partially formed copper damascene structure, located in said opening, in said insulator layer;

performing a boron ion implantation procedure, at an energy between about 20 to 40 KeV, to a region of said partially formed copper damascene structure, to create said boron containing copper region, in a top portion of said partially formed copper damascene structure; and performing said second CMP procedure, to insure complete removal of regions of said thick copper layer, and of said barrier layer, from the top surface of said insulator layer, creating a final copper damascene structure, in said opening, with said boron containing copper region between about 800 to 1500 Angstroms in thickness, located in a top portion of said final copper damascene structure.

2. The method of claim 1, wherein said insulator layer is a silicon oxide layer, obtained via LPCVD or PECVD procedures, at a thickness between about 4000 to 16000 Angstroms.

3. The method of claim 1, wherein said opening, in said insulator layer, is a damascene, or a dual damascene type opening, created via photolithographic and RIE procedures, using $CHF_3$ as an etchant.

4. The method of claim 1, wherein said barrier layer is a tantalum nitride layer, obtained via high density plasma sputtering.

5. The method of claim 1, wherein said thick copper layer is obtained via CVD procedures, at a temperature between about 120 to 230° C.

6. The method of claim 1, wherein said thick copper layer is obtained via an electroplating procedure, using a solution of copper sulfate and sulfuric acid.

7. The method of claim 1, wherein said boron ion implantation procedure is performed at an energy between about 20 to 40 KeV, at a dose between about 1E15 to 5E15 atoms/$cm^2$.

* * * * *